(12) United States Patent
Sindalovsky et al.

(10) Patent No.: US 9,197,460 B1
(45) Date of Patent: Nov. 24, 2015

(54) SLICER TRIM METHODOLGY AND DEVICE

(71) Applicant: LSI Corporation, San Jose, CA (US)

(72) Inventors: Vladimir Sindalovsky, Warrington, PA (US); Lane A. Smith, Easton, PA (US); Niall Fitzgerald, Dublin (IR)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 0 days.

(21) Appl. No.: 14/288,838

(22) Filed: May 28, 2014

Related U.S. Application Data

(60) Provisional application No. 61/987,639, filed on May 2, 2014.

(51) Int. Cl.
*H04L 25/03* (2006.01)
*H04L 27/01* (2006.01)

(52) U.S. Cl.
CPC .... *H04L 25/03159* (2013.01); *H04L 25/03057* (2013.01); *H04L 25/03312* (2013.01); *H04L 27/01* (2013.01); *H04L 2025/03592* (2013.01)

(58) Field of Classification Search
None
See application file for complete search history.

(56) References Cited

U.S. PATENT DOCUMENTS

| | | | |
|---|---|---|---|
| 6,225,937 B1 | 5/2001 | Butler | |
| 6,559,692 B2 * | 5/2003 | Kimball et al. | 327/109 |
| 6,603,415 B1 | 8/2003 | Somayajula | |
| 7,177,352 B1 * | 2/2007 | Plasterer et al. | 375/232 |
| 7,352,242 B1 | 4/2008 | Hughes | |
| 8,198,920 B2 | 6/2012 | Chatal | |

* cited by examiner

*Primary Examiner* — Leon-Viet Nguyen
(74) *Attorney, Agent, or Firm* — Sheridan Ross P.C.

(57) ABSTRACT

Described embodiments provide for, in a receiver circuit employing a data latch, circuitry to adjust trim offset of the data latch to account for latch functional features (e.g., hysteresis and metastability) that may interact with trim of the latch. In accordance with the described embodiments, a trim procedure runs in a pre-selected directions of offset voltage ramp in order to average out the effect of hysteresis and metastability on the final trim offset choice. Different thresholds for accumulated slicer "0" and "1" discrimination of the circuitry to adjust trim offset allows for significant reduction in the number of trim runs, accelerating the slicers' trim process allowing for relatively quick determination of trim offset whenever the slicers are idle.

20 Claims, 4 Drawing Sheets

SLICER TRIM METHODOLGY AND DEVICE

CROSS-REFERENCE TO RELATED APPLICATIONS

This application claims the benefit of the filing date of U.S. provisional application No. 61/987,639, filed on May 2, 2014, the teachings of which are incorporated herein by reference.

BACKGROUND

In many data communication applications, Serializer and De-serializer (SerDes) devices facilitate the transmission between two points of parallel data across a serial link. Data at one point is converted from parallel data to serial data and transmitted through a communications channel to the second point where it received and converted from serial data to parallel data.

At high data rates, frequency-dependent signal loss from the communications channel (e.g., the signal path between the two end points of a serial link) as well as signal dispersion and distortion can occur. As such, the communications channel, whether wired, optical, or wireless, acts as a filter and might be modeled in the frequency domain with a transfer function. Correction for frequency dependent losses of the communications channel, and other forms of signal degradation, often requires signal equalization at a receiver of the signal. Equalization through use of one or more equalizers compensates for the signal degradation to improve communication quality.

An eye pattern, also known as an eye diagram (the "eye"), represents a digital data signal from a receiver that is repetitively sampled and applied to the vertical input (axis), while the horizontal input (axis) represents time as a function of the data rate. The eye diagram allows for evaluation of the combined effects of channel noise and inter-symbol interference on the performance of a baseband pulse-transmission system, and the input data eye is the synchronized superposition of all possible realizations of the signal of interest viewed within a particular Unit interval UI (referred to generally as the EYE).

A data slicer (i.e., a Data Latch) in a SerDes device is used for digitizing an analog signal in the serial data receiver. Precision of the latch threshold has substantial impact on performance (e.g., error rate, jitter tolerance) of the SerDes device. A slicers' accuracy depends on tolerances of manufacturing process and cannot be guaranteed without post manufacturing trimming. In order to make the data slicer threshold independent from integrated circuit (IC) manufacturing imperfections, during an initial phase (or occasionally during operation) the latch is usually subject to a trim procedure which varies offset voltage (e.g., a voltage offset ramp) in order to control latch threshold. A number of latch functional features (e.g., hysteresis and metastability) may interact with trim of the latch. When trimmed, each slicer is provided with zero input signal, and the output of it is averaged over a number of samples to reduce influence of noise and other artifacts in slicer functionality. Trim offset to each slicer is varied until its output is averaged to zero (equal number of "1" and "0" at slicer's output over a number of samples). The offset resulting from trim process is constantly applied to each slicer latch in order to ensure intended threshold independent from manufacturing tolerances.

Known approaches to account for this interaction use multiple trim procedure runs in different directions of offset voltage ramp in order to average out the effect of hysteresis and metastability on the final trim offset choice. The known approaches require a long duration of trim procedure due to multiple trim runs, which makes it impossible to trim slicers quickly at power up and, especially, after exiting power down modes of the SerDes device.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a trim offset is generated for a decision device. A signal including a sequence of equivalent data values is applied to the decision device. The trim offset value is initialized to a first trim value, the trim offset value applied to the decision device to set a decision threshold for the decision device. The trim offset value is varied over a range of trim values defined by a first trim value and a second trim value. An inconclusive region is generated by, for each of the trim values: accumulating at least one of the output values of the decision device, comparing the accumulated output value of the decision device to a high threshold and a low threshold, and classifying, as conclusive or inconclusive, a current value of the trim offset value corresponding to each data value based on the comparison. A desired trim offset value is determined as the trim value about a center of the inconclusive region.

BRIEF DESCRIPTION OF THE DRAWINGS

Other aspects, features, and advantages will become more fully apparent from the following detailed description, the appended claims, and the accompanying drawings in which like reference numerals identify similar or identical elements.

DETAILED DESCRIPTION

Described embodiments provide for, in a receiver circuit employing a data latch, circuitry to adjust trim offset of the data latch to account for latch functional features (e.g., hysteresis and metastability) that may interact with trim of the latch. In accordance with the described embodiments, a trim procedure runs in a pre-selected direction of offset voltage ramp in order to average out the effect of hysteresis and metastability on the final trim offset choice. Different thresholds for slicer "0" and "1" discrimination of the circuitry to adjust trim offset allow for significant reduction in the number of trim runs, accelerating the slicers' trim process allowing for relatively quick determination of trim offset whenever the slicers are idle.

Figure 1:
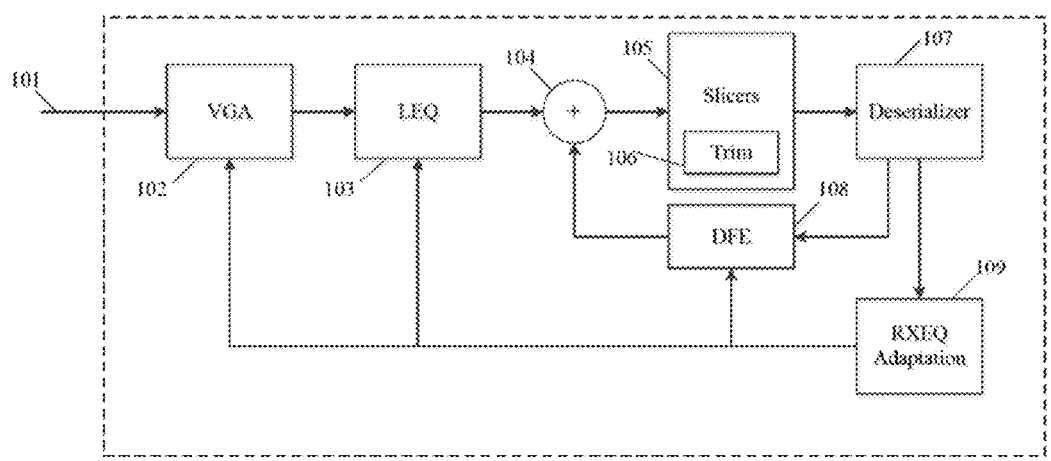
FIG. 1 shows a block diagram of a Serializer-Deserializer (SerDes) receiver employing an exemplary embodiment.

FIG. 1 shows an exemplary serializer-deserializer (SerDes) receiver 100 employing an exemplary embodiment. SerDes receiver 100 includes input amplifier (e.g., variable gain amplifier or VGA) 102, linear equalizer (e.g., analog linear equalizer or LEQ) 103, combiner (usually called summing node) 104, and slicers (e.g., latches) 105. Slicers 105 includes trim circuitry 106, provides decisions for input data, and generates a reconstructed serial data stream. SerDes receiver 100 further includes deserializer 107, decision feedback equalizer (DFE) 108, and receiver equalizer coefficient adaptation circuitry (RXEQ adaptation) 109.

The serial input data from a channel, degraded after transmission through the channel, passes through amplification for enhancement in VGA 102, and then is further enhanced in LEQ 103 to compensate for potential low pass filtering characteristics of the channel. From LEQ 103, the data is sent to a summing node 104 for additional enhancement using output from DFE 108. Slicers 105 provide decisions for input data, and generates the reconstructed serial data stream. Deserializer 107 deserializes the data for output, as well as for input decisions for DFE 108, which decision feedback equalization techniques are well known to those skilled in the art. All of the enhancement parameters are adapted through coefficient adaptation processes of REXQ adaptation 109 in order to achieve maximum horizontal and vertical eye opening seen at (input to) slicers 105, which leads to a low error rate. Hence the accuracy of the latches of slicers 105 (data, transition and error for LMS adaptation algorithm) is important for achieving low SerDes error rates.

Slicers 105 represent one or more decision devices for an input data. As known in the art, the term "slicer" and "latch" are often used interchangeably for a decision device, which compares an input value to a threshold to generate an output decision, and are often implemented as sense amplifiers. Slicers 105 include trim circuitry 106. Trim circuitry 106 performs a trim procedure for each decision device by varying offset voltage (e.g., a voltage offset ramp) in order to control thresholds of latches employed for slicers 105. A number of latch functional features (e.g., hysteresis and metastability) may interact with trim of the latch and these functional features of latches used in slicers 105 may influence the trim process and require special techniques in accordance with described embodiments to mitigate. Slicer latches in, for example, a SerDes device are usually implemented as sense amplifiers in order to obtain high sensitivity to low voltage signals at high speed of operation.

When trimmed, each latch of slicers 105 is provided with a "zero" input signal (all 0's), and the output of it is averaged over a number of samples to reduce influence of noise and other artifacts in slicer functionality. Trim offset to each slicer is varied from a low value to a high value ("down-up") or from a high value to a low value ("up-down") until its output is averaged to zero (equal number of "1" and "0" values seen at the latch's output over a number of samples). The offset resulting from trim process is constantly applied to each latch during normal operation in order to ensure intended threshold independent from manufacturing tolerances.

Figure 2:
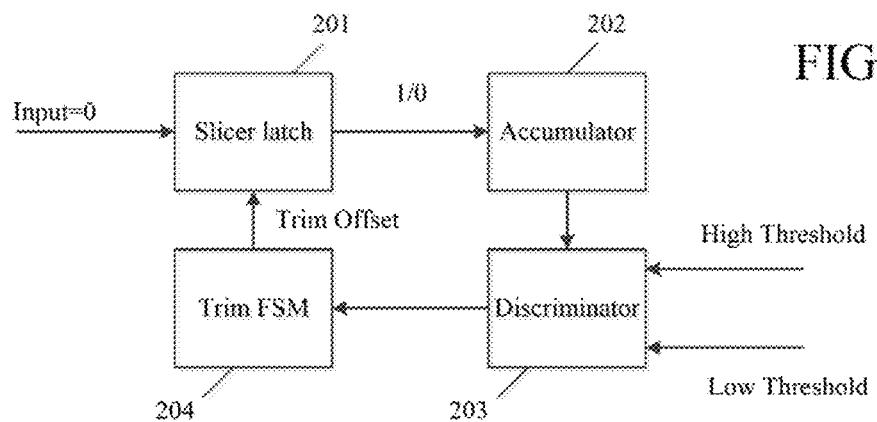
FIG. 2 shows an exemplary embodiment of a trim circuit as employed by the Slicers of FIG. 1.

FIG. 2 shows an exemplary embodiment of trim circuitry 106 as employed by slicers 105 of FIG. 1. The zero input signal is applied to slicer latch 201, and its output accumulated in accumulator 202, The output value in accumulator 202 is applied to discriminator 203, which compares the accumulator value to input "High" and "Low" Thresholds. Discriminator 203 generates an output value based on this comparison between High and Low Thresholds that is applied to trim finite state machine (trim FSM) 204. FSM 204 employs logic to vary the value of trim offset based on its input value.

Figure 3:
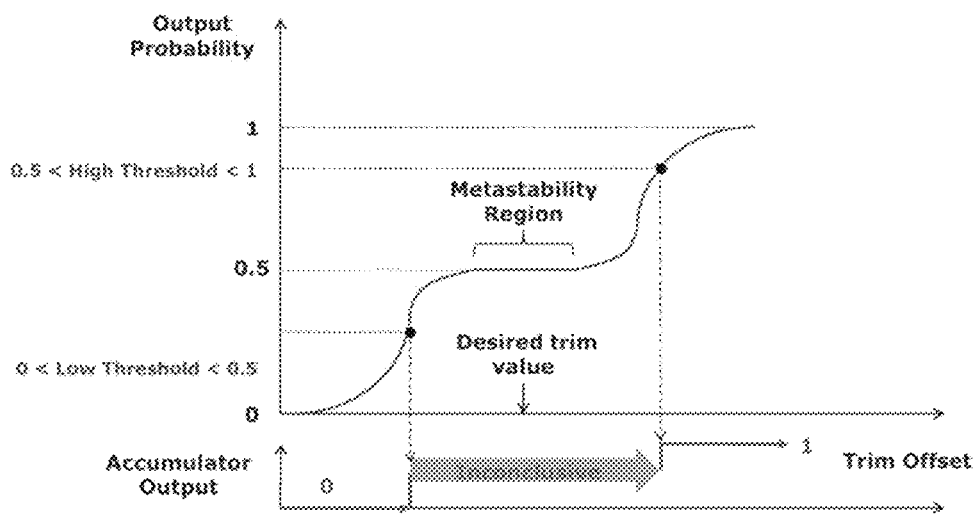
FIG. 3. illustrates a latch's conclusive and inconclusive regions in terms of output probability as a function of input trim as might be experienced by the Slicers of FIG. 1 and employed by exemplary embodiments.

FIG. 3 illustrates a latch's conclusive and inconclusive regions in terms of output probability as a function of input trim. If, during averaging, different thresholds are used to distinguish between output "0" and output "1" scenarios, and any result between the High and Low Thresholds is considered inconclusive, the requirement for multiple trim runs disappears, as illustrated in FIG. 3. In each direction of trim offset change, High and Low Thresholds are applied to an output being a "1" event accumulated over a number of samples. If the accumulated number is below "Low Threshold" then the result is considered to be a reliable "0", if it is above "High Threshold" the result is considered reliable "1", otherwise the result is considered inconclusive. After two runs (one in ascending direction, or down-up, and another in descending direction, or up-down) the trim offsets corresponding to low and high threshold might be averaged, providing a middle trim offset value for metastability and hysteresis regions of the latch.

The digitized output of slicer latch 201 (with input being zero during trim) shown in FIG. 2 is accumulated over a number of samples, allowing for filtering out of noise. Accumulator 202 output is compared to Low and High Thresholds in the discriminator 203 and provided to Trim FSM 204 to make a decision with respect to Trim Offset change as being in a conclusive region or an inconclusive region. Trim FSM 204 also stores and averages the trim range values, and based on the stored/averaged trim range values, determines the trim offset value ("Desired Trim Value" corresponding to the center of the inconclusive region. The result of the trim process of trim circuitry 106 is constant application of Desired Trim Value to (e.g., SerDes) to slicer latch 201 (and so, by extension, to operation of slicers 105 in FIG. 1) to compensate for manufacturing tolerance and operating conditions during normal operation.

To enhance an understanding of the present embodiments, the functional features (artifacts) in slicer behavior, hysteresis and metastability, are described.

Figure 4:
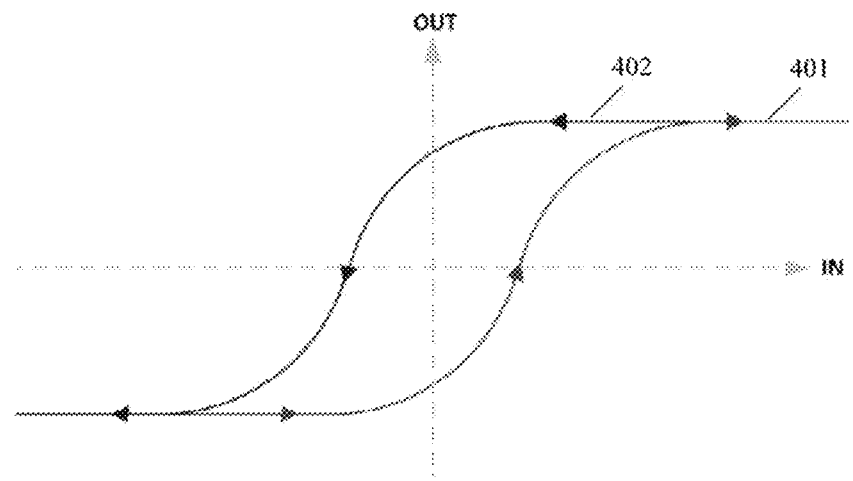
FIG. 4 illustrates hysteresis as might be experienced by the Slicers of FIG. 1.

The first artifact is hysteresis: when an input signal or trim offset is gradually changed in ascending or descending direction (which is a usual arrangement during trim) a slicer may exhibit different threshold. The hysteresis effect is shown in FIG. 4 for input level versus output level. The trace 401 shows slicer output digital level ("1" or "0" when input is changing in ascending direction, the trace 402 shows slicer output digital level ("1" or "0") in descending direction. The difference in levels between traces 401 and 402 may be high enough (e.g., on the order of a few mV) to influence the result of trim. Varying both directions of trim offset change during a trim process allows for averaging results, and the two identified slicer thresholds averaged in order to mitigate the effect of hysteresis.

Figure 5:
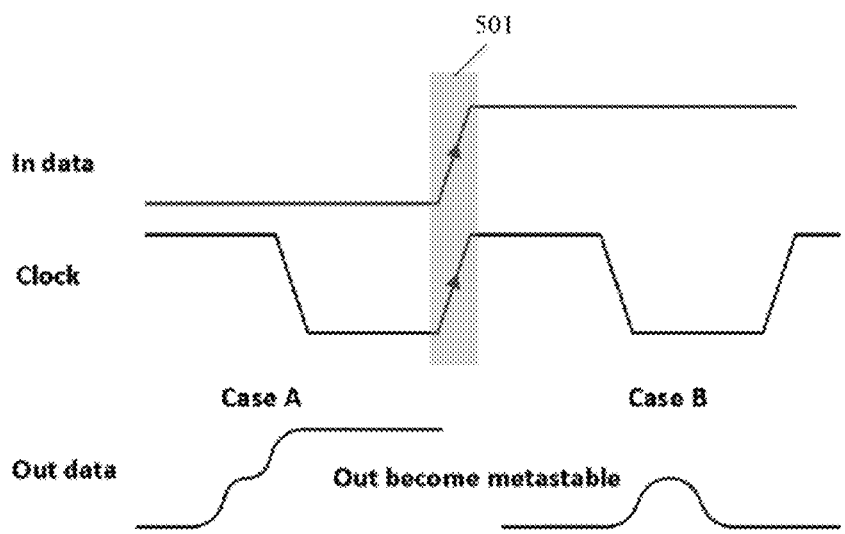
FIG. 5 illustrates metastability as might be experienced by the Slicers of FIG. 1.

The second artifact is metastability, as illustrated in FIG. 5. when a signal changes between high and low logic levels close to the sensing edge of the sampling clock (region 501), the slicer latch may "hesitate" and be unable to resolve the output level one way or another (e.g., case A and case B). Metastability may also occur when the input data level is static and close to the slicer latch's threshold. In both cases, the output may take a relatively longer time to settle. Under metastability conditions, the slicer latch may output a "1" or a "0" with some probability.

Figure 6:
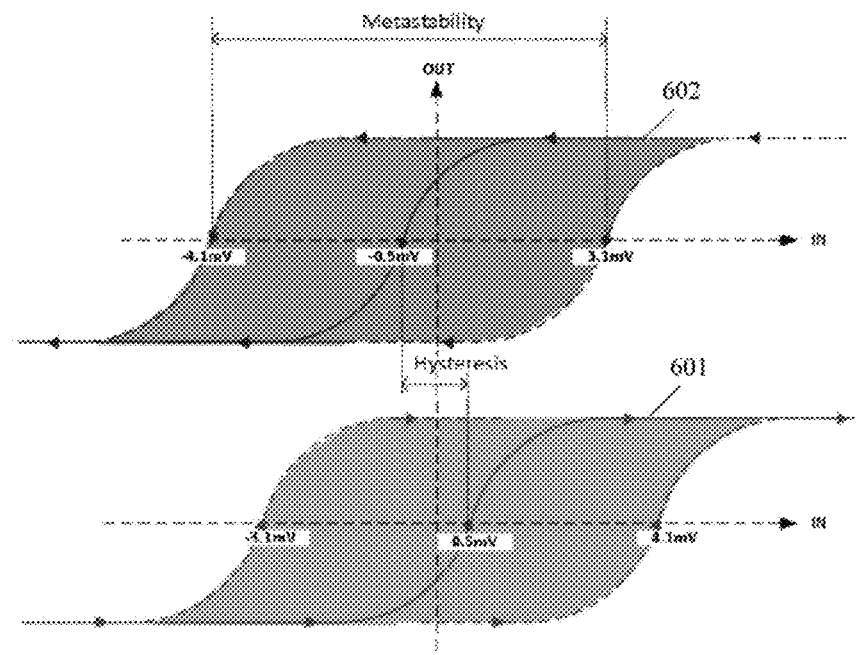
FIG. 6 shows a combined effect of hysteresis and metastability.
Figure 7:
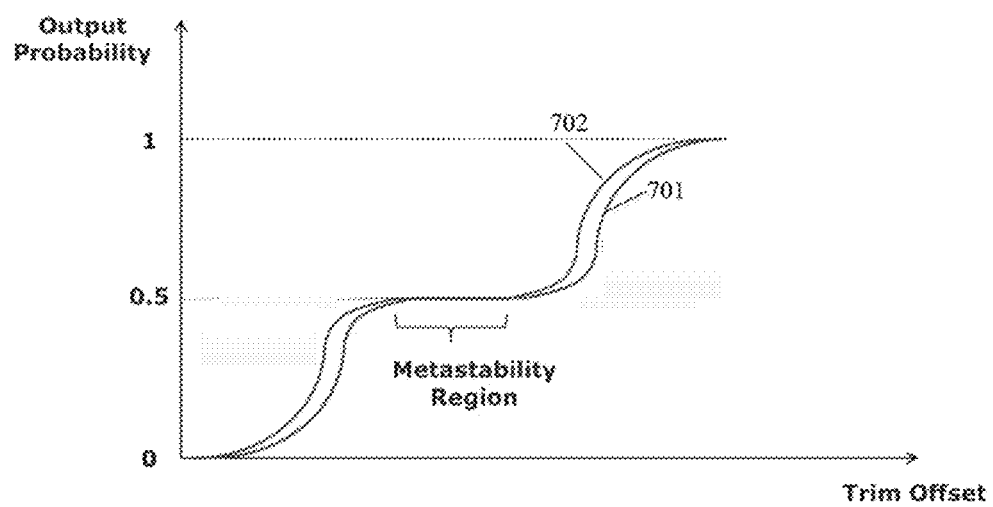
FIG. 7 shows probability of output signal from a slicer being "0" or "1" for a down-up run and an up-down run with combined effect of hysteresis and metastability shown in FIG. 6.

The combined effect of hysteresis and metastability is shown in FIG. 6. The trace region 601 shows slicer output digital level ("1" or "0") when input is changing in ascending direction, the trace region 602 shows slicer output digital level ("1" or "0") in descending direction. As shown in FIG. 6, metastability exhibits uncertainty region of input signal or trim offset in which a slicer may output either "0" or "1". This region is shifted depending on the direction of input signal or trim offset change. The probability of output signal from slicer being "0" or "1" is shown in FIG. 7 for a down-up run 701 and an up-down run 702. FIG. 7. illustrates a latch's conclusive and inconclusive regions in terms of output probability as a function of input trim including the hysteresis effect as given in the previous description of FIG. 5 and the metastability effect as given in the previous description of FIG. 6, which gives roughly 50% probability within the metastability region. The roughly 50% probability within the metastability region implies that statistical evaluation of slicer output may be inconclusive within metastability region. In order to defeat this peculiarity in slicer behavior the trim methods in the art might employ a very high number of multiple trim runs in each direction of trim offset change.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Further, the term "comprises or includes" and/or "comprising or including" used in the document means that one or more other components, steps, operation and/or existence or addition of elements are not excluded in addition to the described components, steps, operation and/or elements.

Signals and corresponding nodes or ports may be referred to by the same name and are interchangeable for purposes here.

No claim element herein is to be construed under the provisions of 35 U.S.C. §112, sixth paragraph, unless the element is expressly recited using the phrase "means for" or "step for."

It is understood that various changes in the details, materials, and arrangements of the parts which have been described and illustrated in order to explain the nature of this invention may be made by those skilled in the art without departing from the scope of the embodiments of the invention as encompassed in the following claims.

We claim:

1. A method of generating a trim offset in a decision device, the method comprising:
    applying a signal including a sequence of equivalent data values to the decision device;
    initializing a trim offset value to a first trim value, the trim offset value applied to the decision device to set a decision threshold for the decision device;
    varying the trim offset value over a range of trim values defined by the first trim value and a second trim value;
    generating an inconclusive region by, for each of the trim values:
        accumulating at least one output value of the decision device,
        comparing the accumulated output value of the decision device to a high threshold and a low threshold, and
        classifying, as conclusive or inconclusive, a current value of the trim offset value corresponding to each data value based on the comparison; and
    determining a desired trim offset value as the trim value about a center of the inconclusive region.

2. The method of claim 1, wherein the generating an inconclusive region comprises:
    varying the trim offset value from the first trim value to the second trim value in the range of trim values; and
    for each of the trim values:
        accumulating a plurality of output values of the decision device and providing an averaged output value;
        comparing the averaged output value to the high threshold and the low threshold;
        classifying, as conclusive, the current trim offset value if the averaged output value i) reaches or exceeds the high threshold or ii) reaches or falls below the low threshold; and
        classifying, as inconclusive, the current trim offset value if the averaged output value is between the high threshold and the low threshold.

3. The method of claim 1, comprising:
    varying the trim offset value from the first trim value to the second trim value and varying the range of trim values defined by a third trim value to a fourth trim value;
    wherein the step of determining a desired trim offset value comprises averaging at least two trim offset values about the center of the inconclusive region.

4. The method of claim 3, wherein the first trim value is less than the second trim value, and the fourth trim value is less than the third trim value.

5. The method of claim 4, wherein the first trim value and the fourth trim value are equivalent, and the second trim value and the third trim value are equivalent.

6. The method of claim 1, wherein the method is embodied in a Serializer/Deserializer (SerDes) device.

7. Apparatus for generating a trim offset, the apparatus comprising:
    a decision device receiving a signal including a sequence of equivalent data values;
    a logic circuitry configured to initialize a trim offset value to a first trim value, the trim offset value applied to the decision device to set a decision threshold for the decision device;
    the logic circuitry configured to vary the trim offset value over a range of trim values defined by the first trim value to a second trim value;
    the logic circuitry configured to generate an inconclusive region by, for each of the trim values:
        accumulating at least one output value of the decision device,
        comparing the accumulated output value of the decision device to a high threshold and a low threshold, and
        classifying, as conclusive or inconclusive, a current value of the trim offset value corresponding to each data value based on the comparison; and
    the logic circuitry configured to determine a desired trim offset value as the trim offset value corresponding to the data value in the sequence about the center of the inconclusive region.

8. The apparatus of claim 7, wherein the logic circuitry is configured to generate an inconclusive region by:
    varying the trim offset value from the first trim value to the second trim value in the range of trim values; and
    the logic circuitry comprises an accumulator, a discriminator and a state machine, and wherein, for each of the trim values:
        accumulator accumulates a plurality of output values of the decision device and provides an averaged output value;
        the discriminator compares the averaged output value to the high threshold and the low threshold; and
        the state machine classifies, as conclusive, the current trim offset value if the averaged output value i) reaches or exceeds the high threshold or ii) reaches or falls below the low threshold; and classifies, as inconclusive, the current trim offset value if the averaged output value is between the high threshold and the low threshold.

9. The apparatus of claim 7, wherein the logic circuitry is configured to:
    vary the trim offset value from the first trim value to the second trim value and vary the range of trim values defined by a third trim value to a fourth trim value;
    wherein the logic circuitry is configured to determine a desired trim offset value by averaging at least two trim offset values about the center of the inconclusive region.

10. The apparatus of claim 9, wherein the first trim value is less than the second trim value, and the fourth trim value is less than the third trim value.

11. The apparatus of claim 10, wherein the first trim value and the fourth trim value are equivalent, and the second trim value and the third trim value are equivalent.

12. The apparatus of claim 7, wherein the decision device is a latch.

13. The apparatus of claim 12, wherein the latch is a sense amplifier.

14. The apparatus of claim 7, wherein the apparatus is embodied in a Serializer/Deserializer (SerDes) device.

15. The apparatus of claim 7, wherein the apparatus is embodied in an integrated circuit.

16. A non-transitory machine-readable storage medium, having encoded thereon program code, wherein, when the program code is executed by a machine, the machine implements a method for generating a trim offset in a decision device, comprising the steps of:

applying a signal including a sequence of equivalent data values to the decision device;

initializing a trim offset value to a first trim value, the trim offset value applied to the decision device to set a decision threshold for the decision device;

varying the trim offset value over a range of trim values defined by the first trim value and a second trim value;

generating an inconclusive region by, for each of the trim values:
- accumulating at least one output value of the decision device,
- comparing the accumulated output value of the decision device to a high threshold and a low threshold, and
- classifying, as conclusive or inconclusive, a current value of the trim offset value corresponding to each data value based on the comparison; and determining a desired trim offset value as the trim value about a center of the inconclusive region.

17. The method of claim 16, wherein the generating an inconclusive region comprises:

varying the trim offset value from the first trim value to the second trim value in the range of trim values; and for each of the trim values:
- accumulating a plurality of output values of the decision device and providing an averaged output value;
- comparing the averaged output value to the high threshold and the low threshold;
- classifying, as conclusive, the current trim offset value if the averaged output value i) reaches or exceeds the high threshold or ii) reaches or falls below the low threshold; and
- classifying, as inconclusive, the current trim offset value if the averaged output value is between the high threshold and the low threshold.

18. The method of claim 16, comprising:

varying the trim offset value from the first trim value to the second trim value and varying the range of trim values defined by a third trim value to a fourth trim value;

wherein the step of determining a desired trim offset value comprises averaging at least two trim offset values about the center of the inconclusive region.

19. The method of claim 18, wherein the first trim value is less than the second trim value, and the fourth trim value is less than the third trim value.

20. The method of claim 19, wherein the first trim value and the fourth trim value are equivalent, and the second trim value and the third trim value are equivalent.

* * * * *